(12) United States Patent
Zhang et al.

(10) Patent No.: US 12,366,385 B2
(45) Date of Patent: Jul. 22, 2025

(54) NANOCOMPOSITE SOLAR ABSORBER WITH ENCAPSULATED METAL NANOPARTICLES

(71) Applicant: Khalifa University of Science and Technology, Abu Dhabi (AE)

(72) Inventors: TieJun Zhang, Abu Dhabi (AE); Aikifa Raza, Abu Dhabi (AE); Afra S. Alketbi, Abu Dhabi (AE); Rajakumar Devarapalli, Abu Dhabi (AE); Hongxia Li, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 169 days.

(21) Appl. No.: 17/795,504

(22) PCT Filed: Feb. 12, 2021

(86) PCT No.: PCT/IB2021/051199
§ 371 (c)(1),
(2) Date: Jul. 26, 2022

(87) PCT Pub. No.: WO2021/161259
PCT Pub. Date: Aug. 19, 2021

(65) Prior Publication Data
US 2023/0144255 A1      May 11, 2023

Related U.S. Application Data

(60) Provisional application No. 62/975,994, filed on Feb. 13, 2020.

(51) Int. Cl.
*F24S 70/16*       (2018.01)
*C09D 5/00*        (2006.01)
(Continued)

(52) U.S. Cl.
CPC .............. *F24S 70/16* (2018.05); *C09D 5/006* (2013.01); *C23C 14/0688* (2013.01);
(Continued)

(58) Field of Classification Search
CPC .......... F24S 70/16; C09D 5/006; C23C 14/34; C23C 14/0688
(Continued)

(56) References Cited

U.S. PATENT DOCUMENTS

2009/0272422 A1*  11/2009  Li ......................... H10F 77/126
                                                                 136/244
2010/0313875 A1   12/2010  Kennedy
(Continued)

FOREIGN PATENT DOCUMENTS

KR            101111047 B1     2/2012

OTHER PUBLICATIONS

Alketbi, Afra, et. al.; Sputtered SiC coatings for radiative cooling and light absorption; Nov. 27, 2018; Journal of Photonics for Energy; whole document (Year: 2024).*
(Continued)

*Primary Examiner* — Tahseen Khan
(74) *Attorney, Agent, or Firm* — Kilpatrick Townsend & Stockton LLP (57) ABSTRACT

Aspects of the disclosure include a multilayer surface-covering assembly adapted to convert solar radiation to heat. The multilayer surface-covering assembly may include a first composite layer comprising a first amorphous refractory material and first metal nanoparticles, wherein the first amorphous refractor material encapsulates the first metal nanoparticles, and wherein the first composite layer is thermally coupled with a surface of a structure for conduction of heat from the first composite layer to the structure. The multilayer surface-covering assembly may also include an
(Continued)

antireflective layer, wherein the first composite layer is disposed between the antireflective layer and the surface of the structure.

13 Claims, 5 Drawing Sheets

(51) Int. Cl.
*C23C 14/06* (2006.01)
*C23C 14/34* (2006.01)
*F24S 70/12* (2018.01)
*F24S 70/20* (2018.01)

(52) U.S. Cl.
CPC .............. *C23C 14/34* (2013.01); *F24S 70/12* (2018.05); *F24S 70/20* (2018.05)

(58) Field of Classification Search
USPC ........................................................ 428/215
See application file for complete search history.

(56) References Cited

U.S. PATENT DOCUMENTS

2015/0015960 A1   1/2015   Ren et al.
2015/0107582 A1   4/2015   Jin et al.
2017/0336102 A1*  11/2017  Ren .......................... F24S 70/30

OTHER PUBLICATIONS

Pang et. al.; High-Temperature Tolerance in Multi-Scale Cermet Solar-Selective Absorbing Coatings Prepared by Laser Cladding; Jun. 19, 2018; MDPI; 11, 1037; whole document (Year: 2024).*
PCT/IB2021/051199, International Search Report and Written Opinion, Mailed on May 14, 2021, 11 pages.
F. Cao et al., "A review of cermet-based spectrally selective solar absorbers," Energy Environ. Sci. 7(5), 1615-1627 (2014).
J. Y. Lu et al., "Effective dielectric constants and spectral density analysis of plasmonic nanocomposites," J. Appl. Phys. 120, 163103 (2016).
Q.C. Zhang, "Direct current magnetron sputtered W-AlN cermet solar absorber films," J. Vac. Sci. Technol. A 15(6), 2842-2846 (1997).
L. Zheng et al., "Angular solar absorptance and thermal stability of Mo—SiO2 double cermet solar selective absorber coating," Sol. Energy 115, 341-346 (2015).
F. Cao et al., "A high-temperature stable spectrally-selective solar absorber based on cermet of titanium nitride in SiO2 deposited on lanthanum aluminate," Sol. Energy Mater. Sol. Cells 160, 12-17 (2017).
A. Duta et al., "Coloured Solar-thermal Absorbers—A Comparative Analysis of Cermet Structures," Energy Procedia 48, 543-553 (2014).
J. Y. Lu et al., "Near-Perfect Ultrathin Nanocomposite Absorber with Self-Formed Topping Plasmonic Nanoparticles," Adv. Opt. Mater. 5(18), 1700222 (2017).
G. Y. Chung, et al., "Effect of nitric oxide annealing on the interface trap densities near the band edges in the 4H polytype of silicon carbide", Appl. Phys. Lett. 76, 1713 (2000).
A. S. Alketbi, et al., "Sputtered SiC coatings for radiative cooling and light absorption," Journal of Photonics for Energy 9(3), 032703 (2018).

* cited by examiner

NANOCOMPOSITE SOLAR ABSORBER WITH ENCAPSULATED METAL NANOPARTICLES

CROSS-REFERENCE TO RELATED APPLICATIONS

This application claims priority to U.S. Provisional Application 62/975,994, filed on Feb. 13, 2020, the entire contents of which is incorporated herein in its entirety.

TECHNICAL FIELD

Aspects of the disclosure relate to composite coatings as well as methods of fabrication of the composite coatings. In particular, multilayer composite coatings for solar absorber applications are described, including amorphous refractory-metal composite materials having improved radiation absorption properties.

BACKGROUND

Solar absorber coatings are materials developed to exhibit broad absorption of solar radiation (e.g., ultraviolet, visible, and near infrared radiation) for conversion into heat to be provided to a working fluid or other thermal carrier. Such coatings are found in technology including, but not limited to, energy generation, desalination, or other solar concentrator applications. The range of available solar absorber coatings are limited to those that can withstand the operating conditions that may exceed hundreds of degrees Celcius. For example, at the elevated temperatures under which such systems operate, accelerated chemical degradation, such as oxidation of metals, may significantly limit the effectiveness of non-refractory materials. Materials that are better suited as solar absorbers in terms of optical properties may be susceptible to thermal oxidation, limiting the efficiency of the absorber coatings at elevated temperatures.

SUMMARY

Broadband absorptive coating materials and methods of preparing the coating are provided. In some embodiments, a nanocomposite coating of amorphous ceramic material incorporating metal nanoparticle inclusions can be formed using a high-throughput co-sputtering approach with improved thermal and oxidation resistance. The intrinsic narrow absorption band of amorphous refractory materials may be broadened by adding different concentrations of self-formed metal nanoparticles and/or nano clusters during co-sputtering. Solar absorber coatings may include an absorptive stack including one or more layers of silicon carbide. Each constituent layer of the absorptive stack may vary in thickness. The total thickness of the solar absorber coating may be less than or about 100 nm. When deposited on an infrared-reflective substrate and overlaid with an anti-reflective layer, solar absorber coatings may exhibit solar absorptance greater than or about 90% or more in the range of 250-2500 nm with thermal emittance below or about 0.1 at 650 K. Beside contributing to the solar absorptance, an amorphous refractory matrix may also act as a diffusion barrier, preventing interlayer migration and oxidation of metal nanoparticles during annealing processes and during high-temperature operation as part of solar concentrator systems. For simplicity and clarity, examples are provided that focus on tungsten as an infrared-reflective material, owing to its high reflectance in infra-red region (R%=94.6 at $\lambda$=2.5 µm) and high thermal stability, and silicon carbide as a refractory matrix material. That being said, embodiments of the present disclosure are not limited to tungsten metal-silicon carbide ceramic composites.

With improved solar absorptance, thermal stability, and chemical stability, solar absorber coatings may maintain an improved optical performance at temperatures greater than or about 500-700 Celsius. To that end, materials, methods, and systems are provided to facilitate the design and optimization of selective solar absorbers for enhancing solar energy harvesting at medium-to-high temperatures in various systems, including but not limited to solar heating and cooling, concentrated solar power, solar thermoelectrics, and solar thermal photovoltaics.

In one aspect, disclosed herein is a multilayer surface-covering assembly adapted to covert solar radiation to heat. In some embodiments, the multilayer surface-covering assembly comprises a first composite layer comprising a first amorphous refractory material and first metal nanoparticles. In some embodiments, the first amorphous refractor material encapsulates the first metal nanoparticles. In some embodiments, the first composite layer is thermally coupled with a surface of a structure for conduction of heat from the first composite layer to the structure. In some embodiments, the multilayer surface-covering assembly comprises an antireflective layer. In some embodiments, the first composite layer is disposed between the antireflective layer and the surface of the structure.

In some embodiments, the multilayer surface-covering assembly further comprises an infrared-reflective layer on silicon substrate disposed between the first composite layer and the surface of the structure.

In some embodiments, the first amorphous refractory material prevents diffusion of the first metal nanoparticles within the first refractory coating and prevents oxidation of the first metal nanoparticles.

In some embodiments, the first metal nanoparticles have a characteristic dimension in a range of 4-7 nm.

In some embodiments, the multilayer surface-covering assembly further comprises a second composite layer comprising a second amorphous refractory material and second metal nanoparticles. In some embodiments, the second amorphous refractor material encapsulates the second metal nanoparticles. In some embodiments, the second composite layer is disposed between the first composite layer and the antireflective layer. In some embodiments, a first weight/volume percentage concentration of the first metal nanoparticles in the first composite layer is greater than a second weight/volume percentage concentration of the second metal nanoparticles in the second composite layer.

In some embodiments, the multilayer surface-covering assembly further comprises a third composite layer comprising a third amorphous refractory material and third metal nanoparticles.

In some embodiments, the third amorphous refractor material encapsulates the third metal nanoparticles. In some embodiments, the third composite layer is disposed between the second composite layer and the antireflective layer. In some embodiments, a third weight/volume percentage concentration of the third metal nanoparticles in the third composite layer is less than the second weight/volume percentage concentration.

In some embodiments, the first metal nanoparticles comprise tungsten nanoparticles. In some embodiments, the first amorphous refractory material comprises silicon carbide. In some embodiments, the second metal nanoparticles comprise tungsten nanoparticles. In some embodiments, the second amorphous refractory material comprises silicon carbide. In some embodiments, the third metal nanoparticles comprise tungsten nanoparticles. In some embodiments, the third amorphous refractory material comprises silicon carbide. It will be understood that the multilayer surface-covering assembly can comprise one or more or any combination of the above embodiments.

In some embodiments of the multilayer surface-covering assembly, the first weight/volume percentage concentration is equal to or greater than 20%; the second weight/volume percentage concentration is equal to or greater than 5% and equal to or less than 30%; and/or the third weight/volume percentage concentration is equal to or less than 10%. In some embodiments, the third weight/volume percentage concentration is 0%.

In some embodiments, the multilayer surface-covering assembly maintains thermal stability. For example, in some embodiments, the assembly maintains its optical performance after thermal annealing in vacuum and air. In some embodiments, the assembly maintains its optical performance after thermal annealing, wherein the annealing temperature is about 750 degree centigrade in vacuum, and about 630 degree centigrade in air.

In another aspect, described herein is a spectrally selective solar radiation absorber. In some embodiments, the spectrally selective solar radiation absorber comprises a reflective substrate. In some embodiments, the spectrally selective solar radiation absorber also comprises a stack of silicon carbide-metal composite layers overlying the reflective substrate. In some embodiments, each of the silicon carbide-metal composite layers comprises metal nano-inclusions within a silicon carbide matrix.

In some embodiments, the silicon carbide-metal composite layers comprise a first layer having a first weight/volume percentage concentration of the metal nano-inclusions, a second layer having a second weight/volume percentage concentration of the metal nano-inclusions, and/or a third layer having a third weight/volume percentage concentration of the metal nano-inclusions. In some embodiments, the first weight/volume percentage concentration is greater than the second weight/volume percentage concentration. In some embodiments, the second weight/volume percentage concentration is greater than the third weight/volume percentage concentration.

In some embodiments, the first weight/volume percentage concentration is approximately 28%; the second weight/volume percentage concentration is approximately 12%; and/or the third weight/volume percentage concentration is less than 5%. In some embodiments, the first layer has a thickness of about 33 nm; the second layer has a thickness of about 25 nm; and/or the third layer has a thickness of about 20 nm.

In some embodiments, the stack of silicon carbide-metal composite layers has an average absorptance of at least 91% in a wavelength range of 280 2000 nm.

In some embodiments, the solar radiation absorber further comprises an antireflective coating. In some embodiments, the antireflective coating is formed overlying the stack of silicon carbide-metal composite layers.

In some embodiments, the stack of silicon carbide-metal composite layers in conjunction with the antireflective coating has an average absorptance of at least 95% in a wavelength range of 280-2000 nm. In some embodiments, the antireflective coating has a thickness from about 20 to about 25 nm. In some embodiments, the stack of silicon carbide-metal composite layers has a thickness of less than 100 nm.

In another aspect, the disclosure provides a method of forming a multilayer surface-covering assembly adapted to covert solar radiation to heat. In some embodiments, the method comprises depositing a first composite layer so as to be in thermal communication with a surface of a structure for conduction of heat from the first composite layer to the structure. In some embodiments, the first composite layer comprises a first amorphous refractory material and first metal nanoparticles. In some embodiments, the first amorphous refractory material encapsulates the first metal nanoparticles. In some embodiments, the method comprises depositing an antireflective layer. In some embodiments, the first composite layer is disposed between the antireflective layer and the surface of the structure.

In some embodiments, the method further comprises depositing a second composite layer so as to be in thermal communication with a surface of the first composite layer. In some embodiments, the second composite layer comprises the first amorphous refractory material and the first metal nanoparticles. In some embodiments, the first amorphous refractory material encapsulates the first metal nanoparticles. In some embodiments, a concentration of the first metal nanoparticles in the second composite layer is less than a concentration of the first metal nanoparticles in the first composite layer. In some embodiments, the method comprises depositing a third composite layer so as to be in thermal communication with a surface of the second composite layer. In some embodiments, the third composite layer comprises the first amorphous refractory material and is substantially free of the first metal nanoparticles.

In some embodiments, the concentration of the first metal nanoparticles in the first composite layer is approximately 28%. In some embodiments, the concentration of the first metal nanoparticles in the second composite layer is approximately 12%.

In some embodiments, the first amorphous refractory material comprises silicon carbide. In some embodiments, the first metal nanoparticles comprise tungsten.

In any of the embodiments described herein, the layers of the multilayer surface-covering assembly or spectrally selective solar radiation absorber can be deposited using a co-sputtering or vapor deposition process. In some embodiments, the vapor deposition comprises a physical vapor deposition process. Thus, in some embodiments, the first composite layer, the second composite layer, and/or the third composite layer is deposited using co-sputtering or vapor deposition. In some embodiments, the vapor deposition comprises a physical vapor deposition process. In some embodiments, the first composite layer, the second composite layer, and/or the third composite layer is deposited at a temperature from about 25 degrees C. to about 400 degrees C.

The foregoing, together with other features and embodiments will become more apparent upon referring to the following specification, claims, and accompanying drawings.

DETAILED DESCRIPTION Of THE FIGURES

Solar absorber materials and methods of fabricating optimized solar absorber composite coatings are provided. As described in more detail in the context of the forthcoming illustrative examples, solar absorber materials may be characterized by chemical and physical stability at elevated temperatures of hundreds or thousands of degrees Celsius. Robust materials are effective as solar absorbers during the operation of solar concentrator systems used in power generation, desalination, or other processes where solar radiation is used as a source of heat (e.g., to do work or induce phase change). While refractory materials, such as ceramic materials, are well suited to high-temperature operation, many such materials are non-ideal absorbers of solar radiation, and exhibit characteristic drops in absorptance in the visible spectral range, the infrared (IR) spectral range, or both. Metals, by contrast, may exhibit improved absorptance in one or more ranges, but are susceptible to oxidation at elevated temperatures in the presence of oxygen e.g., in air) and exhibit elevated diffusion at high temperature.

To that end, refractory-metal composite materials are provided exhibiting improved absorptance characteristics, both in terms of spectral range and percentage, reduced thickness, and improved chemical stability at operational temperatures. Improvements are relative to refractory absorber coatings and refractory-metal coatings characterized by different morphologies. In particular, embodiments described herein include refractory-metal composites containing encapsulated metal nanoparticles incorporated within an amorphous refractory matrix. Furthermore, coatings formed from the refractory-metal composites may include multiple layers of differing metal concentration bonded to an infrared-reflective layer, which may further improve the performance and robustness of the materials as solar absorber coatings.

In some embodiments, methods and systems are presented to automatically (e.g., without human intervention) optimize a solar absorber coating as part of an optimization approach. For example, an optimization system may include one or more machine-learning models configured to process electron microscopy images of composite materials to extract morphology information of phases in the composite material, tuning models configured to improve the predicted absorptance of coatings using the morphology and other physical characteristics, generate new composite configurations, and facilitate the fabrication of coatings through communication with fabrication systems (e.g., over a network). Fabrication systems, in turn, may include plasma-based deposition systems configured to form composite coatings on a substrate with controlled composition and thickness.

For the purposes of the present disclosure, the following terms are provided:

The term "absorptance" describes the effectiveness of the coating material in absorbing radiant energy. It describes a non-dimensional ratio of the absorbed to the incident radiant power, expressed as a percentage.

The term "composite" describes a material which is produced from two or more constituent materials. Constituent materials may have distinct chemical or physical properties and may create a material with properties that differ from those of the constituent materials. Constituent materials within a composite may remain separate and distinct as opposed to mixtures and solid solutions where constituent materials may be indistinguishable.

The term "machine-learning model" describes models that may include neural network models, rules based models, and/or object models, which include learned parameters trained or tuned parameters or hyper-parameters) by which a computer may be configured to generate a predicted and/or modeled output. Learning may be implemented by learning algorithms, such as supervised or unsupervised learning algorithms, by which an objective function is minimized over a number of training epochs, using a set of training data that may be labeled or unlabeled.

The term "stack" refers to a multilayer structure incorporating two or more layers of material having different composition and/or properties. For example, an absorber stack may be a composite material having multiple layers of composite of different composition to provide spectrally selective absorptance in distinct layers of the absorber stack.

The term "support vector machine" describes a supervised learning model with associated learning algorithm(s) that is trained to analyze data for classification and regression analysis. As an example, a support vector machine may be trained to analyze image data to classify pixels into various learned classes.

Figure 1:
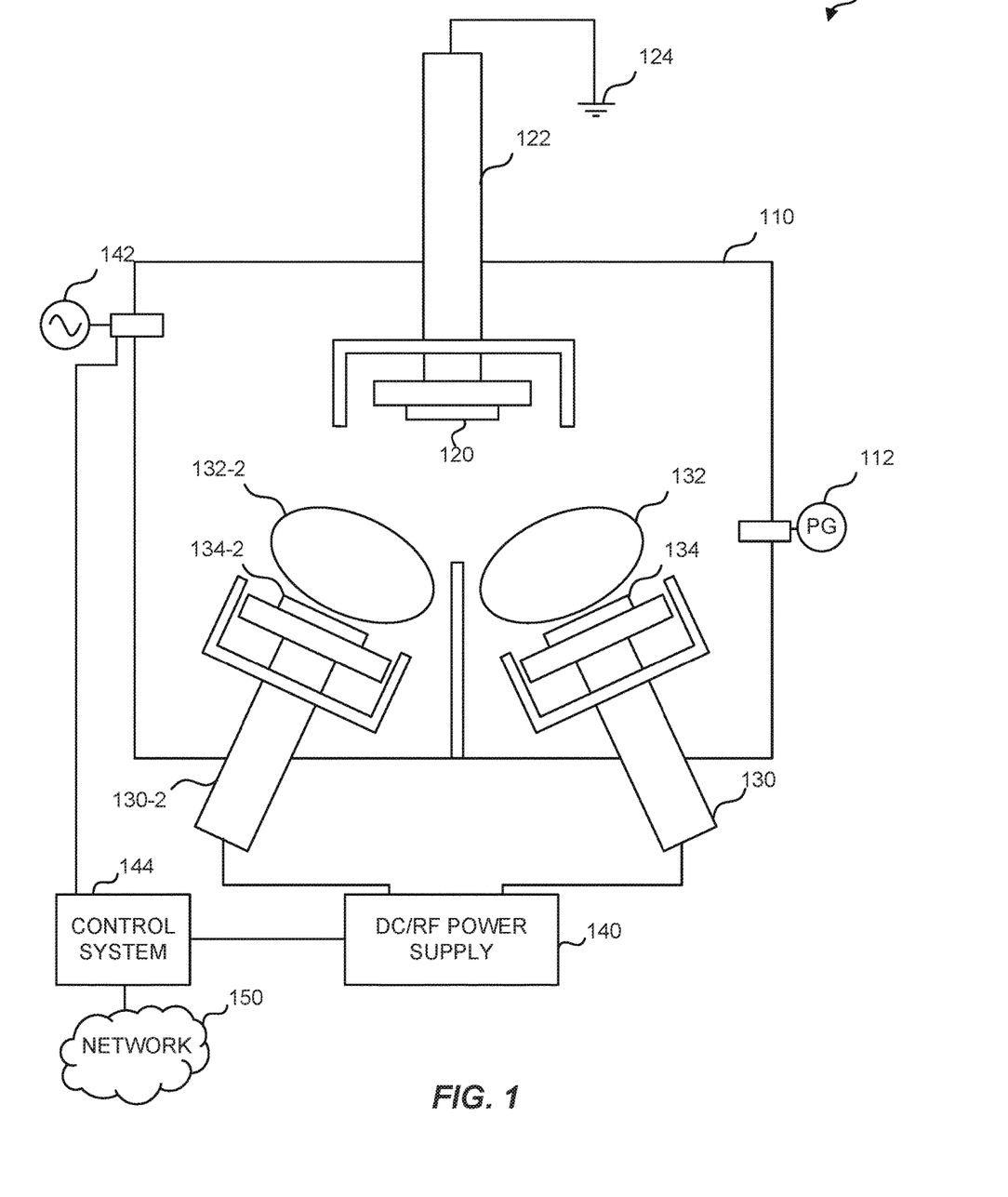
FIG. 1 is a schematic diagram of a deposition system, according to embodiments described herein.

FIG. 1 is a schematic diagram of a deposition system 100, according to embodiments described herein. The deposition system 100 may be configured to deposit one or more layers of refractory-metal composite in a controlled environment, such that a material is fabricated that is characterized by improved performance or improved properties, such as improved absorptance, chemical and physical stability, and reduced dimensions, relative to conventional absorber materials. While the description of the deposition system 100 focuses on magnetron co-deposition systems, the deposition system 100 may also include other types of systems configured to deposit ceramic and/or metal coatings with controlled composition and structure. For example, other plasma sources, rather than magnetron sources, may be employed, and the configuration of internal components and chamber elements of the deposition system 100 may differ from what is illustrated in FIG. 1. It is to be understood that the deposition system 100 is illustrated in schematic cross section, and may omit components from the illustration in the interest of simplicity of explanation that may be included in the functioning of the deposition system 100. Furthermore, the deposition system 100 may be of any size, commensurate with depositing composite coatings onto substrates appropriate for intended solar absorber applications. For example, in space technology, the size of the deposition system 100 may be relatively small, when compared to the size used to deposit coatings onto components incorporated into terrestrial systems for industrial scale solar-thermal installations.

As shown in FIG. 1, the deposition system 100 may include several component subsystems, incorporated into a chamber 110 configured to provide a reduced pressure environment and/or a controlled environment within the chamber 110. Reduced pressure may be maintained within the chamber 110 through a vacuum system and a gas supply system, such that a controlled and/or metered flow of gas, such as an inert plasma gas (e.g., helium, argon, or nitrogen)

may be introduced into the chamber 110 via an inlet and removed via an outlet or exhaust. Conditions within the chamber 110 may be measured by one or more sensors 112 integrated into the chamber, including, but not limited to, temperature, pressure, or oxygen sensors, by which the gas supply and removal systems may provide the appropriate deposition conditions.

The deposition system 100 may be configured to deposit a coating onto a substrate 120, which may be positioned at a target position relative to one or more deposition sources 130. In some embodiments, the substrate 120 is held to a substrate holder 122 that may be configured to bias the substrate 120, for example by electrically coupling the substrate 120 to a relative ground 124. In a co-deposition configuration, the chamber 110 may incorporate two deposition sources 130, positioned at particular angle to deposit onto the substrate 120. In some embodiments, each deposition source 130 is a magnetron source that is configured to produce a plasma 132 near the surface of a target 134. In this way, a gas of atoms may be generated from the target 134 by ion bombardment from the plasma 132 into the surface of the target 134. Atoms of the target material may be directed toward the substrate 120 and may deposit onto the surface of the substrate, for example, by line-of-sight deposition or by electrostatic precipitation where the substrate is biased.

In some embodiments, the chamber 110 includes a second target 134-2 of a material different from the target 134, such that a coating may be deposited onto the substrate 120 having a controlled composition of the material of the second target 134-2 in the material of the target 134. As an illustrative example, the target 134 may be or include a refractory material, such as silicon carbide, silicon nitride, silicon dioxide, boron nitride, boron carbide, zirconium nitride, or other materials including silicon, zirconium, carbon, boron, or nitrogen. By contrast, the second target 134-2 may be or include a metal, such as a refractory metal including, but not limited to, niobium, molybdenum, tantalum, tungsten, or rhenium. In some embodiments, the metals may also include iron, cobalt, titanium, vanadium, chromium, zirconium, hafnium, ruthenium, rhodium, osmium, or iridium. To limit the introduction of oxygen into deposited coatings, the material of the target 134 may exclude oxygen-containing ceramics, such as silicon oxide.

Deposition of composite coatings onto the substrate 120 may be controlled by modulation of the plasma 132 in time and intensity, which in turn may control the flux of atoms that are generated by exposure of the target 134 to the plasma 132. In this way, the concentration of the deposited coating, as well as attendant characteristics including, but not limited to, phase structure and nanostructuring of the composite, may be controlled. In an illustrative example, the second target 134 may be held in a second deposition source 130-2 that may be independently control led relative to another deposition source 130 having another target 134. In this way, a second plasma 132-2 may be formed such that the second target 134-2 is exposed to a different flux relative to the other target 134, and may be adjusted over additional deposition cycles to produce concentration gradients in the deposited composite coating on the substrate 120, or to produce discrete layers as part of an absorber stack, as described in more detail in reference to FIG. 2. For example, multiple layers may be formed sequentially over three discrete deposition cycles, such that each subsequent layer overlies the preceding layer.

In some embodiments, precise control of the thickness of deposition is provided by inclusion of deposition sensors 142, as part of a control system 144. The deposition sensor 142 may be or include a resonator-type sensor (e.g., a quartz crystal sensor), a thermal-mass sensor, a resistance sensor, or other form of deposition-sensitive circuit that permits the precise and non-invasive measurement of the thickness of composite material deposited onto the substrate 120. In this way, the control system 144 may implement a deposition protocol by which a multi-layer absorber stack may be formed. The deposition protocol may also include gas exchange operations, such as purging the chamber 110 between deposition cycles, as an approach to reducing contamination and for improving discrete concentration steps between layers of an absorber stack. The deposition system 100 may also include components or subsystems for depositing reflective and/or anti-reflective material coatings onto the substrate 120. For example, the substrate 120 may be provided with a reflective coating before forming the absorber layers. Similarly, the final absorber layer of an absorber stack may be coated by an anti-reflective coating, as described in more detail in reference to FIG. 2.

In some embodiments, the control system 144 may be configured to implement a fabrication process including the deposition protocol that may be received via a network 150. Through communication with a system configured to optimize the structure of absorber materials, the deposition system 100 may automatically implement outputs of optimization systems, as described in more detail in reference to FIGS. 4-5.

Figure 2:
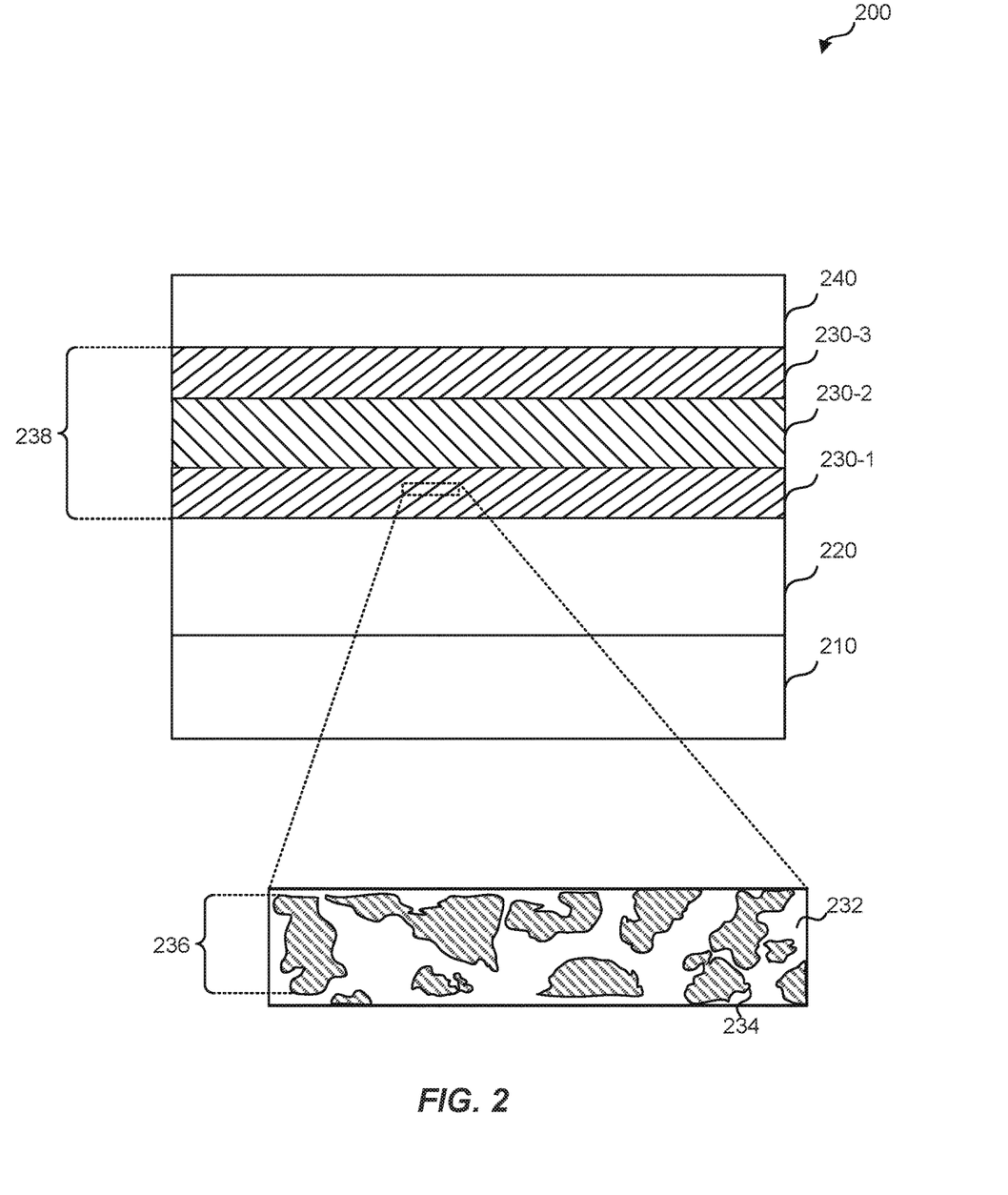
FIG. 2 is a schematic diagram of a refractory-metal composite, according to embodiments described herein.

FIG. 2 is a schematic diagram of a solar absorber coating 200, according to embodiments described herein. The materials included in the solar absorber coating 200 may be selected and/or deposited as part of a process of fabricating a solar absorber coating onto a part or a structure that will be integrated into a solar concentrator system. In this way, the constituent materials and structures described in reference to FIG. 2 may impart improved performance of the solar concentrator, for example, by improving efficiency of energy conversion from incident solar radiation to heat (e.g., phonons) that may be conducted into the material and applied to a working fluid or to a phase-change material. For example, the solar absorber coating 200 may be formed as a deposited multilayer coating onto a solar concentrator target, such as a would be found in a solar-driven Seebeck effect-based thermoelectric generator in space systems, in a terrestrial mirror-array concentrator system, or in a solar desalination system. Through spatially-controlled composition, structure, and chemical and physical properties, the refractory-metal composite may exhibit improved absorptance properties, as described in more detail in reference to FIG. 3, at a reduced size.

In some embodiments, the solar absorber coating 200 may be or include an absorber stack formed of multiple material layers deposited on a substrate 210. The substrate 210 may be or include a material of a size corresponding to the intended solar absorber application. The substrate 210 in FIG. 2 is illustrated as being similar in dimensions to the overlying layers merely for simplicity of explanation of internal structures and materials of the solar absorber coating 200. For example, the substrate 210 may be or include a component of a solar concentrator system (e.g., flat sheets, circular tubes, a fin or other meta-structured material, such as a honeycomb or faceted surface). Similarly, the substrate 210 may be of any size, corresponding to the intended application. For example, the dimensions of the substrate 210 may include a relative dimension on the order of micrometers, millimeters, centimeters, or meters.

As part of the coating formed on the substrate 210, a reflective layer 220 may be formed overlying the substrate 210. The reflective layer 220 may be or include a material selected for high reflectance in the infrared region, and thermal stability. For example, the reflective layer 220 may be or include tungsten as an infrared reflector material, owing to its high reflectance in infrared region (R %=94.6 at λ>2.5 μm) and thermal stability at temperatures as high as hundreds of degrees Celsius, thousands of degrees Celsius, or more. As described in more detail in reference to FIG. 1, where the reflective layer 220 includes a metal that is also incorporated into composite layers of the solar absorber coating 200, the reflective layer 220 may be formed on the substrate 210 by depositing the metal alone, rather than by co-deposition of two materials concurrently. The infrared reflector material may serve to improve the conversion efficiency of the solar absorber coating 200 such that a higher fraction of incident radiation is converted to heat to be conducted into the substrate 210.

Overlying the reflective layer 220, the solar absorber coating 200 may include one or more refractory-metal composite layers 230. While the solar absorber coating 200 is illustrated with three refractory-metal composite layers 230, in some embodiments more or fewer refractory-metal composite layers 230 are included in the solar absorber coating 200. For example, the solar absorber coating 200 may include one, two, three, four, or more refractory-metal composite layers 230, overlying the reflective layer 220 or the substrate 210.

In some embodiments, the refractory-metal composite layers 230 may include different compositions and microstructures that may impart different absorptance properties to the different layers. For example, a refractory-metal composite layer 230 may be characterized by a microstructure including encapsulated metal nanoparticles 234 in a refractory matrix 232. In some embodiments, the metal nanoparticles 234 are described by a characteristic dimension 236, which may correspond to the dimension defining the functionality of the metal nanoparticles 234. For example, where the metal nanoparticles 234 may be described by an aspect ratio approaching a value of one, the characteristic dimension 236 may describe an approximate anisotropic diameter of the metal nanoparticles 234. Where the metal nanoparticles 234 are described by an aspect ratio larger than one, as when the nanoparticles are nanowires or nanorods, the characteristic dimension 236 may describe a dimension orthogonal to a long axis of the metal nanoparticles 234 (e.g., in cylindrical coordinates, "$\vec{r}$" vs. "$\vec{z}$").

The characteristic dimension 236 may influence the spectral range within which the metal nanoparticles 234 can affect the absorptance of the refractory-metal composite layer 230. For example, with increasing size, the metal nanoparticles 234 may cause a red shift in absorptance in the infrared range for the refractory-metal composite layer 230. Furthermore, beyond a threshold size, the metal nanoparticles 234 may exhibit a diminished absorptance, and begin to negatively impact physical or chemical stability of the refractory-metal composite layer 230. As such, there may be a range of the characteristic dimension 234 within which the metal nanoparticles 234 improve the absorptance of the refractory-metal composite layer 230. In this way, the characteristic dimension 236 may be less than or about 20 nm, less than or about 18 nm, less than or about 16 nm, less than or about 14 nm, less than or about 12 nm, less than or about 10 nm, less than or about 8 nm, less than or about 7 nm, less than or about 6 nm, less than or about 5 nm, less than or about 4 nm, less than or about 3 nm, less than or about 2 nm, less than or about 1 nm, or less. In some embodiments, as described in more detail in reference to FIG. 1, the metal nanoparticles 234 are formed by aggregation and/or coalescence in the gas phase or on the surface of a deposition substrate (e.g., substrate 120 of FIG. 1). For example, the metal nanoparticles 234 may be or include nanoclusters of smaller particles. In this way, the characteristic dimension 236 may describe a distribution with a statistical variance, rather than a single uniform size for every metal nanoparticle 234 within the refractory-metal composite layer 230. The distribution may be normal or non-normal (e.g., Gaussian, Maxwellian, etc.).

As described in more detail in reference to FIG. 1, the ceramic matrix 232 and the metal nanoparticles 234 may be formed by co-deposition of a ceramic material and a metal in a deposition system (e.g., deposition system 100 of FIG. 1), where a first refractory-metal composite layer 230-1 differs in composition from a second refractory-metal composite layer 230-2, and from a third refractory-metal composite layer 230-3. In some embodiments, the first refractory-metal composite layer 230-1 includes a higher metal composition than the second refractory-metal composite layer 230-2, and the second refractory-metal composite layer 230-2 includes a higher metal composition than the third refractory-metal composite layer 230-3. In some embodiments, the stability and robustness of the solar absorber material 200 may be improved by introducing the particles into the layers. For example, providing a third refractory-metal composite layer 230-3 being substantially free of metal nanoparticles 234, may permit the third layer 230-3 to serve as a diffusion barrier to oxygen, such that the metal nanoparticles 234 in the lower layers may be protected against oxidation (e.g., where synthesis proceeds in an inert atmosphere). Furthermore, metal nanoparticles 234 may be further protected against oxidation by encapsulating the metal nanoparticles 234 in the ceramic matrix 232.

As with the characteristic dimension 236, by incorporating metal nanoparticles 234 at a concentration within an optimal range into the refractory matrix 232, the refractive index and the extinction coefficient of the refractory-metal composite layer 230 may increase from that of pure refractory within the wavelength range of 250-1000 nm. In this way, the refractory-metal composite layer 230 may broaden the intrinsic absorption band of refractory films. Particularly, the increase of refractive index in the wavelength range of 400-1000 nm may allow refractory-metal composite layers 230 to have a broad absorption in the wavelength range of 250-1000 nm. Without being bound to a particular physical phenomenon, theory, or mechanism, destructive interference induced by the distribution of metal nanoparticles 234 within the refractory-metal composite layer 230 may influence the absorbance of radiation within layers of the solar absorber 200 within one or more wavelength ranges. For example, to design a spectrally selective solar absorber, the refractive indices and thicknesses of each layer can be tuned to obtain destructive interference at wavelengths around 0.4 μm and 1.5 μm. As such, reduced reflectance of solar radiation and consequent improvement in absorptance may result from material properties of the refractory-metal composite layers 230. As described in more detail in reference to FIGS. 2-5, tuning the material properties of the refractory-metal composite layers 230 may be implemented by an optimization technique for determining both thicknesses of the refractory-metal composite layers 230 and the metal composition of each respective layer.

In some embodiments, the refractory-metal composite layers 230 may be or include amorphous silicon carbide making up the refractory matrix 232 and tungsten metal making up the metal nanoparticles 234. Silicon carbide with different polymorphs is a material characterized by a tunable bandgap (2.3-3.2 eV), high radiation resistance, stability at high temperatures, and high thermal conductivity. Higher optical absorption of amorphous silicon carbide in the photon energy region below the band gap with respect to its crystalline phase makes it particularly suitable to high temperature light absorption applications, such as solar concentrator systems.

As illustrated in FIG. 2, the refractory-metal composite layers 230 may have a combined thickness 238. At larger thicknesses, a single layer of as-sputtered amorphous silicon carbide behaves as a blackbody absorber over the range of 250 nm to 20 µm, To improve the infrared transparency, a thinner silicon carbide layer may be deposited. For example, infrared transparency of silicon carbide may be improved at a thickness 238 of less than or about 300 nm, less than or about 250 nm, less than or about 200 nm, less than or about 150 nm, less than or about 100 nm, less than or about 50 nm, or less. Even so, the uniform refractive index of a single layer of silicon carbide film may result in limited or negligible interference effects and may thus produce a narrow absorption band. To that end, the solar absorber coating 200 may include multiple refractory-metal composite layers 230 as an approach to provide multiple different refractive indexes within the silicon carbide matrix. In some cases, the multiple different refractive indexes may be provided by incorporating metal nanoparticles 234 and/or nanoclusters into the refractory-metal composite layers 230 at differing concentrations.

As an illustrative example, the amorphous ceramic matrix may be or include silicon carbide. Amorphous silicon carbide may be characterized by a non-zero extinction coefficient and a refractive index of 2.3-2.6 in the wavelengths range of 250-700 nm, which differs from other dielectric materials, such as silicon oxide and aluminum oxide. A single layer of silicon carbide deposited on an infrared-reflective substrate to a thickness 238 below 100 nm may display narrow absorption. In this way, by incorporating tungsten nanoparticles 234 and/or nano-clusters at a concentration within a range between about 10-40% into the silicon carbide matrix, both the refractive index and extinction coefficient may be increased relative to pure silicon carbide within the wavelength range of 250-1000 nm. Consequently, incorporating tungsten may broaden the intrinsic narrow absorption band of silicon carbide films through the interference effect. In this way, increasing the refractive index in the wavelength range of 400-1000 nm may permit the refractory-metal composite layers 230 to have a broad absorption range and destructive interference within the refractory-metal composite layers 230. Destructive interference within the layers may reduce reflectance of incident radiation and improve absorptance. Advantageously, a spectrally selective solar absorber, the refractive indices and thicknesses of each of the refractory-metal composite layers 230 may be selected, for example through fabrication of layers with a given metal nanoparticle concentration and layer thickness, such that the layers provide destructive interference at wavelengths around 0.4 µm and 1.5 µm that serves to broaden absorptance spectra of the solar absorber coating 200.

In some embodiments, the concentrations of metal nanoparticles 234 in the respective layers of the solar absorber coating 200 may be selected to provide improved optical properties. For example, in some embodiments, where the amorphous ceramic matrix may be or include silicon carbide and the metal may be or include tungsten, the concentration of metal nanoparticles 234 and/or nano-clusters within the silicon carbide matrix may be graduated from a highest value to zero from bottom to top. As such, the solar absorber coating 200 may include an absorptive stack of three layers of varying thickness from bottom to top with thickness of about 33 nm, about 25 nm, and about 20 nm, such that the thickness 238 is less than or about 100 nm. In some embodiments, the concentration of metal nanoparticles 234 may be about 28%, about 12%, and about 0%, for the first layer 230-1, the second layer 230-2, and the third layer 230-3, respectively.

In some embodiments, a nonzero extinction coefficient of the third layer 230-3, which may be or include silicon carbide substantially free of metal nanoparticles 234, may contribute towards the reflection of some of the solar irradiations. Therefore, the solar absorber coating 200 may include an anti-reflective (AR) layer 240, as an additional layer overlying the third layer 230-3. In some embodiments, the AR layer 240 may be or include an oxide material including, but not limited to silicon oxide, which may serve to mediate the transition in index of refraction between the material of the third layer 230-3 and air or other medium surrounding the solar absorber coating 200. Advantageously, with the AR coating 240, the absorptance of the solar absorber coating 200 including the absorptive stack may higher than or about 95.45% in the range of 280-2000 nm.

As described in more detail in reference to FIGS. 2-5, the dimensions, concentrations, and other characteristic properties of the solar absorber material 200 may be determined to provide improved optical properties. For example, the solar absorber coating 200 may be characterized by a sharp transition from high absorptance to low absorptance in the mid infra-red range, which may suggesting good reflectivity of the refractory-metal composite layers 230 and the reflective substrate 220. At higher operating temperatures of 900 and 1050 K, the solar absorber coating 200 may exhibit improved emissivity of 0.18 and 0.22, respectively.

Figure 3:
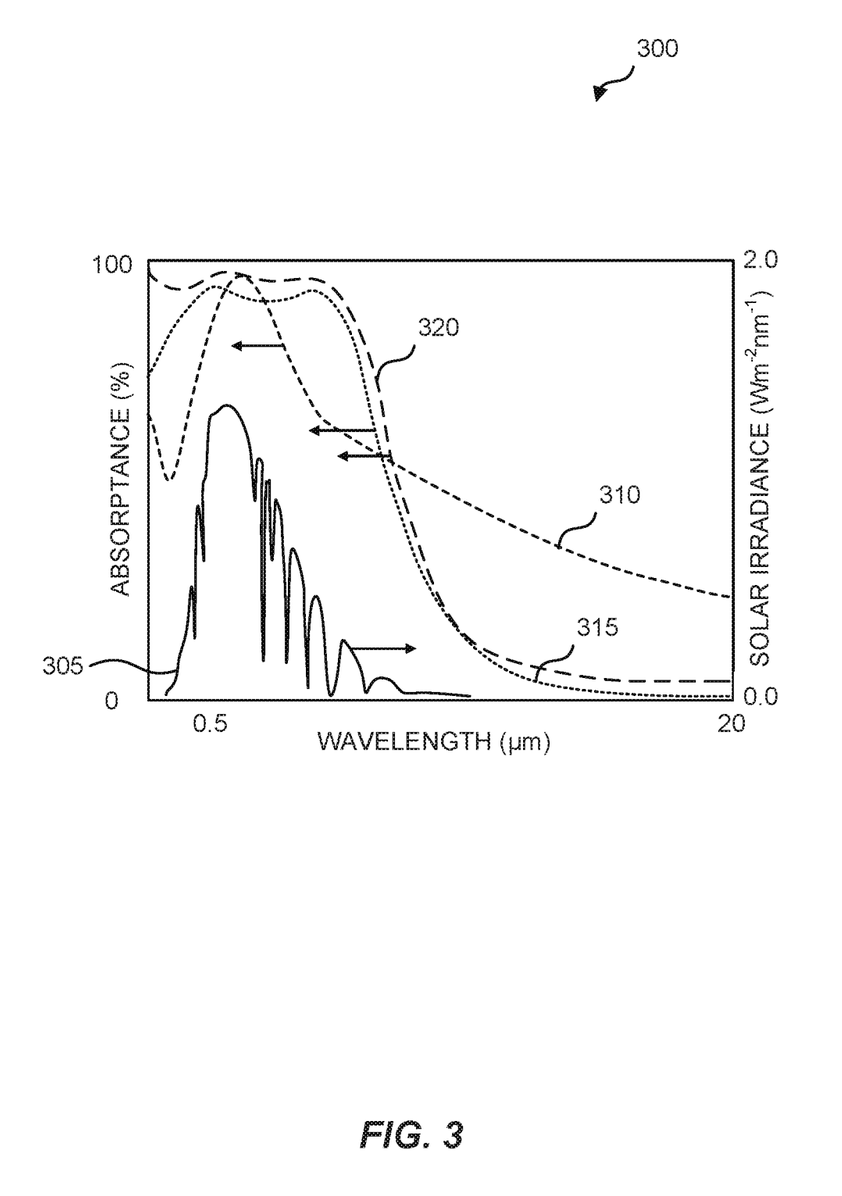
FIG. 3 is a plot of illustrative absorptance spectra of refractory-metal composites, according to embodiments described herein.

FIG. 3 is a plot 300 of illustrative absorptance spectra of refractory-metal composites, according to embodiments described herein. As described in more detail in reference to FIG. 2, introduction of a multilayer absorptive stack incorporating encapsulated metal nanoparticles (e.g., metal nanoparticles 234) into solar absorber coatings (e.g., solar absorber coating 200 of FIG. 2) may improve the optical properties of the solar absorber coatings. Without being bound to a particular theory or physical mechanism, the improvement exhibited in the absorptance spectrum of the solar absorber coating may be attributed at least in part to a graduated refractive index introduced by an increasing nanoparticle concentration from a lowest value near an outer surface of the coating to a highest value near a surface of a reflective substrate.

As illustrated in FIG. 3, incident radiation 305, such as solar radiation, may be described by a characteristic spectrum including ultraviolet, visible, near infrared, and infrared wavelengths. The incident radiation 305 may be characterized by a non-uniform spectral pattern, as may be described by black body radiation curves, such as Planck's law, taking into account characteristic absorbance patterns of atmospheric gases. In general, the performance of a solar absorber coating may be improved by broadening the absorptance (%) over the range of wavelengths for which the incident radiation 305 flux is high, to increase the extent to which radiation is absorbed and to reduce the fraction of incident radiation 305 is reflected or otherwise lost to inefficiency (e phase transitions or chemical reactions). In this context of the plot 300, broadening the absorptance spectrum and increasing the absorptance of a solar absorber coating in the wavelength range corresponding to the solar emission spectrum may improve the efficiency and performance of the coating.

As described in reference to FIG. 2, a characteristic absorptance spectrum for a pure refractory material 310 may be characterized by a relatively narrow absorptance band over the range of the incident radiation 305. While the peak in absorptance for the pure refractory material 310 may overlap with a region of relatively high radiation flux, improving the absorptance over the broader range of the incident radiation 305 may improve to overall performance of solar absorber coatings. To that end, the characteristic spectrum for a solar absorber material including an absorptive stack 315 as described in reference to FIG. 2 may be characterized by a broader absorptance over the broader range of the incident radiation 305. The improvement may be attributable at least in part to the variation of index of refraction within the absorptive stack, such that destructive interference within the solar absorber coating improves the absorption of the incident radiation 305 over a broader wavelength range. Furthermore, as described in more detail in reference to FIG. 2, an AR coating on the absorptive stack may result in an improved absorptance spectrum 320 of the solar absorber materials, for example, by improving the absorptance of the solar absorber coating in the ultraviolet-visible wavelength ranges, where the refractory matrix material is relatively more reflective.

In some embodiments, the solar absorber coatings may be improved by introducing multiple absorber layers over a reflective substrate, for which the layers may have differing thicknesses and metal composition. That being said, configuring the solar absorber coating may be a relatively complex process that may also be improved, for example, through the computer-implemented optimization techniques.

Figure 4:
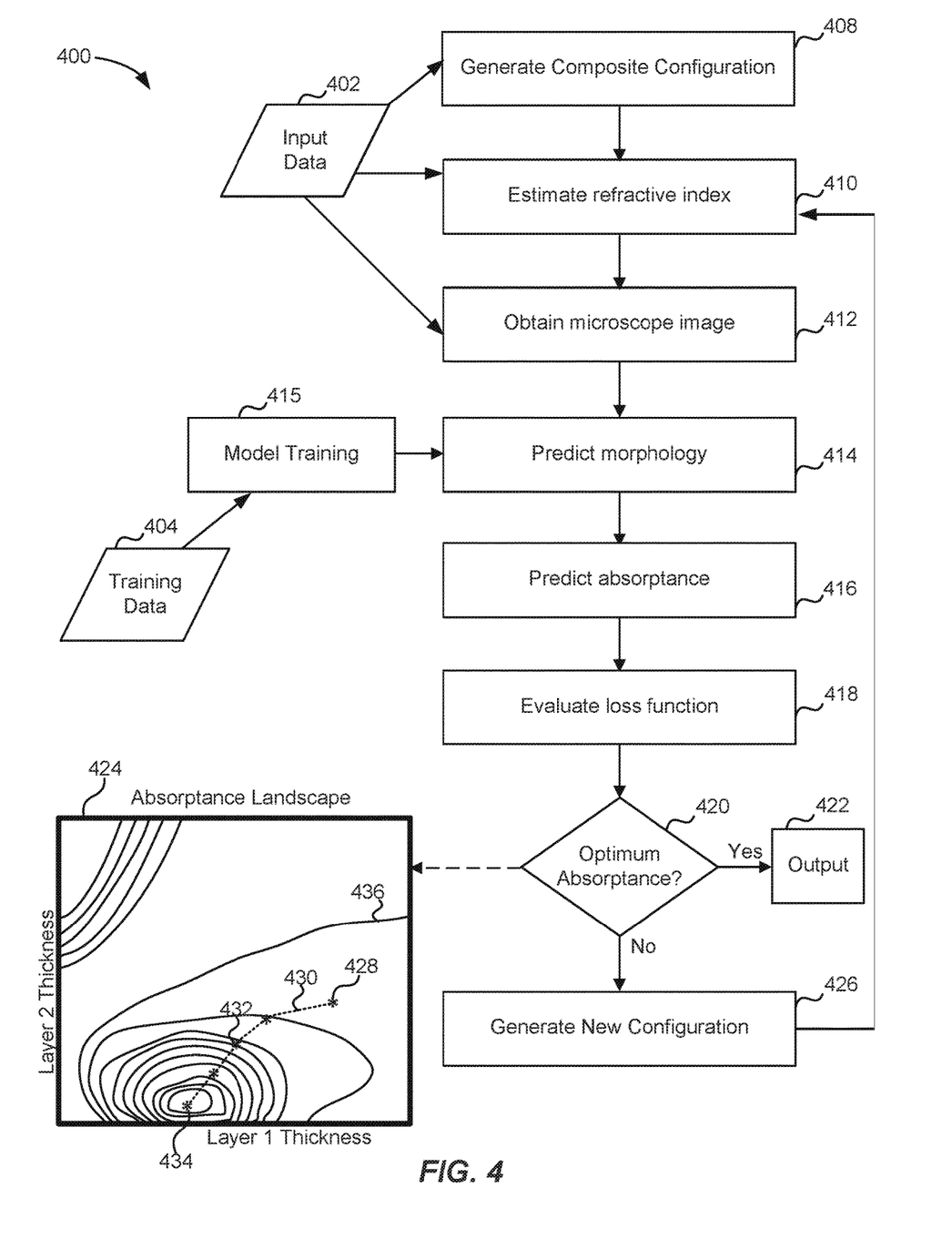
FIG. 4 is a block flow diagram of a method 400 of configuring a solar absorber coating including an absorptive stack of refractory-metal composite layers, according to embodiments described herein.

FIG. 4 is a block flow diagram of a method 400 of configuring a solar absorber coating including an absorptive stack of refractory-metal composite layers, according to embodiments described herein. The method 400 may include operations for predicting and evaluating candidate coating configurations over one or more iterations, until the configuration converges to an optimum absorptance value, which may be described as an average value over a given wavelength range. In some embodiments, the method 400 may incorporate multiple rules-based and/or machine-learning models to provide different inputs to predict the absorptance and to evaluate a loss function. The iterative aspects of the method 400 may permit optimization techniques, such as gradient ascent or other approaches, to be implemented as part of generating new configurations for subsequent evaluation until the value of the loss function is minimized.

The operations of the flow can be implemented as hardware circuitry and/or stored as computer-readable instructions on a non-transitory computer-readable medium of a computer system. As implemented, the instructions represent modules that include circuitry or code executable by a processor(s) of the computer system. The execution of such instructions configures the computer system to perform the specific operations described herein. Each circuitry or code in combination with the processor performs the respective operation(s). While the operations are illustrated in a particular order, it should be understood that no particular order is necessary and that one or more operations may be omitted, skipped, and/or reordered.

As illustrated in FIG. 4, the method 400 may include operation 408, which nay include generating a configuration of a composite solar absorber coating (e.g., solar absorber coating 200 of FIG. 2). As described in more detail in reference to FIG. 2, the configuration may include dimensions and properties of a reflective substrate layer, an absorber stack including one or more refractory-metal composite layers, and/or an antireflective (AR) coating. In some embodiments, generating the composite configuration may include taking in input data 402, which may be or include characteristic spectra of incident radiation (e.g., incident radiation 305 of FIG. 3), characteristic spectra of pure materials (e.g., pure material 310 of FIG. 3), and/or composites (e.g., curves 310 and 315 of FIG. 3). While the input data 402 is illustrated as a single data source, the data may be accessed and/or received from separate systems, such as different databases, servers, devices, or the like.

In an illustrative example, the input data 402 may describe an initial configuration for a solar absorber coating including three refractory-metal composite layers, a reflective substrate, and an AR coating, where the thicknesses of each layer and the overall thickness of the absorptive stack may be specified as falling within a range. The ranges may be governed by physical and chemical properties of the composite materials. For example, the range may be limited on a lower-boundary by the concentration at which the refractive index of the composite material is within a given range, while the range may be limited on an upper boundary by phase segregation that may occur during fabrication, which may result in vulnerability to oxidation at elevated operating temperatures. For example, a first layer (e.g., first layer 230-1 of FIG. 2) may include a metal at a concentration greater than or about 1% by weight, greater than or about 5% by weight, greater than or about 10% by weight, greater than or about 15% by weight, 20% by weight, greater than or about 25% by weight, greater than or about 30% by weight, greater than or about 35% by weight, greater than or about 40% by weight, greater than or about 45% by weight, or greater. A second layer, which may overly the first layer in the absorptive stack (e.g., second layer 230-2 of FIG. 2) may include the metal at a concentration less than the first layer, and the third layer, which may overly the second layer in the absorptive stack (e.g., third layer 230-3 of FIG. 3), and may include less metal than the second layer, and may be substantially free of metal.

Subsequent generating the configuration at operation 408, the method 400 may include estimating and/or receiving refractive indices for each of the layers in the absorptive stack at operation 410. Refractive index data may be used when calculating, predicting, and/or modelling the absorptance of refractory-metal composite layers (e.g., refractory-composite layers 230 of FIG. 2) in two different ways: (i) by using empirical data for effective refractive indices of sample nanocomposite layers characterized by surface diagnostic techniques, such as ellipsometry, or (ii) by using refractive index data for pure refractory and metal material and fitting with morphology data extracted from microscope images, as described in more detail in reference to FIG. 5. As such, operation 410 may include receiving and/or accessing refractive index data for pure materials and for composite samples, for example, as part of a database of materials characteristics. Where the configuration generated at operation 408 includes layers for which empirical refractive index data is available, operation 410 may therefore be accessed directly. By contrast, for configurations where empirical data is unavailable, materials from which the absorptive stack is constructed may be referenced for pure material data. Pure material data may, in turn, be used with microscope images to predict absorptance for the composite material using finite different time domain simulation (FWD).

Subsequent estimating the refractive indices of each of the layers making up the absorptive stack, the method 400 may include obtaining electron microscope images of a refractory-metal composite layer at operation 412. As described in more detail in reference to FIG. 5, microscope images, such as transmission electron microscope images, z-contrast electron microscope images, or other imaging techniques sensitive to atomic number. Z-contrast imaging may be used to prepare an image to predict a morphology, using image processing techniques. In some embodiments, electron microscope images may be obtained from a database of empirical data prepared from standard samples fabricated by co-deposition, as described in more detail in reference to FIG. 1. Alternatively, electron microscope images may be provided by a user of a system implementing the method 400, for example, via a communication component, such as a user interface. For example, the method 400 may optionally include operations where constituent layers of the configuration generated at operation 408 is fabricated in a deposition system (e.g., deposition system 100 of FIG. 1). From electron microscope characterization of the layers, images may be captures and received at operation 412, from which the morphology of metal nanoparticles (e.g., metal nanoparticles 234 of FIG. 2) may be predicted.

Subsequent operation 412, the method 400 may include predicting a morphology of a constituent layer of the absorptive stack. As described in more detail in reference to FIG. 5, operation 414 may include one or more image processing operations, by which a microscope image may be processed to identify metal nanoparticles encapsulated in a matrix material. Processing may include phase detection, background subtraction, and cluster detection. A processed image may be provided as an input to a machine-learning model, trained to predict a morphology of the material from the image. In some embodiments, the machine-learning model may be or include a support vector machine. The support vector machine model may be trained to classify pixels in the microscope image into one of a number of classes, which may be attributed to the refractory material, the metal, an impurity, and/or an unresolved class. In some cases, the support vector machine may be trained to classify only two classes, corresponding to the refractory and the metal, from which clusters may be determined and a pixel map of the material may be generated describing the morphology of the refractory-metal composite layer. The pixel map may, in turn, be used to predict the absorptance of the layer through numerical simulation.

As part of the method 400, the machine-learning model may be trained at operation 415, which may precede the operations of the method 400. For example, model training may include, but is not limited to, supervised training using labeled training data 404, by which learned parameters of the machine-learning model may be adjusted over a number of training epochs, until the model is trained to accurately distinguish metal from refractory and to delineate the boundaries of the phases in the processed microscope image, Model training at operation 415 may include optimizing an objective function, which may be or include a nearest-neighbors or other distance-based evaluation of clustering.

Subsequent predicting the morphology of the refractory-metal composite layers, the method 400 may include predicting the absorptance of the configuration at operation 416. Prediction of absorptance for each constituent layer and for the configuration overall may include one or more numerical electrodynamic simulations, for example, using FWD. For example, morphology data may be imported into an FDTD simulation, for which the regions may be classified by material. For example, in a silicon carbide-tungsten composite, the light and dark regions of a processed microscope image may be classified as silicon carbide and tungsten, respectively. As part of FDTD, time-dependent Maxwell's equations (in partial differential form) may be discretized using central-difference approximations to the space and time partial derivatives. The resulting finite-difference equations may be solved to model a steady-state electromagnetic field behavior for the material. In this way, optical properties resulting from interactions between the material and light, such as absorptance, may be simulated with a high degree of accuracy.

Subsequent predicting the absorptance, the method 400 may include evaluating a loss function at operation 418, as part of optimizing the configuration generated at operation 408. The loss function may include terms that describe a target absorptance, may define an absorptance landscape 424 (e.g., a multi-dimensional function in terms of several parameters), or may include differential terms to address the marginal change in the absorptance over multiple iterations of the method 400. In this way, the method 400 may include, at decision operation 420, a determination of whether the configuration is an optimum configuration. In some embodiments, the determination may be based on a comparison of the absorptance with a threshold absorptance, with a determination of the marginal change in absorptance relative to the previous configuration and a determination of whether improvement in the absorptance is expected to be significant, and/or a localization of the configuration on the absorptance landscape 424.

In some embodiments, the decision operation 420 outputs a Boolean value, such that where the output is true, the method 400 includes outputting the configuration at operation 422. Outputting the configuration may include, but is not limited to, facilitating the fabrication of a solar absorber coating according to the configuration. For example, the method 400 may be implemented using a system that is in communication with a co-deposition system, such that an optimized configuration generated by the method may be automatically (e.g., without human intervention) fabricated onto a reflective substrate, such as a part to be incorporated into a solar concentrator. In some embodiments, outputting the configuration may include generating a data output or visualization of the configuration (e.g., a data readout, a diagram, and/or the absorptance landscape 424). For example, the absorptance landscape 424 may be plotted such that the configuration may be indicated as a state 428 on an optimization trajectory 430 through one or more intermediate states 432 to a final state 434. The visualization that may be generated as part of operation 422 may correspond to the form of optimization being employed by the method 400. In some embodiments, optimization may include a multi-variate optimization of dimensions of layers and concentrations of metal in the layers of the absorptive stack, such that optimization iterations may include univariate and/or multivariate optimization including, for example, techniques including, but not limited to, gradient descent optimization, based on limitations on the number of iterations available. The visalization of the absorptance landscape 424 may also include absorptance contours 436, which may be simulated based on model data or may be developed as additional iterations are prepared and analyzed.

Where the decision operation 420 is false, for example, where the marginal increase in absorptance is significant or where a threshold absorptance value at a given wavelength or over a wavelength range does not satisfy a threshold value, the method 400 may include generating a new configuration at operation 426. Generating the new configuration file may include defining a new configuration based on the preceding configuration, for example, based on a multivariate optimization algorithm. In some embodiments, optimization may include applying a gradient descent approach, such that the new configuration may be defined by varying one or more variables based on a value of a gradient in absorptance as a function of the one or more variables. Once defined, the constituent operations of the method 400 may be repeated in a new iteration for the new configuration, and may be repeated in this way until the output of the decision operation 420 is true.

Figure 5:
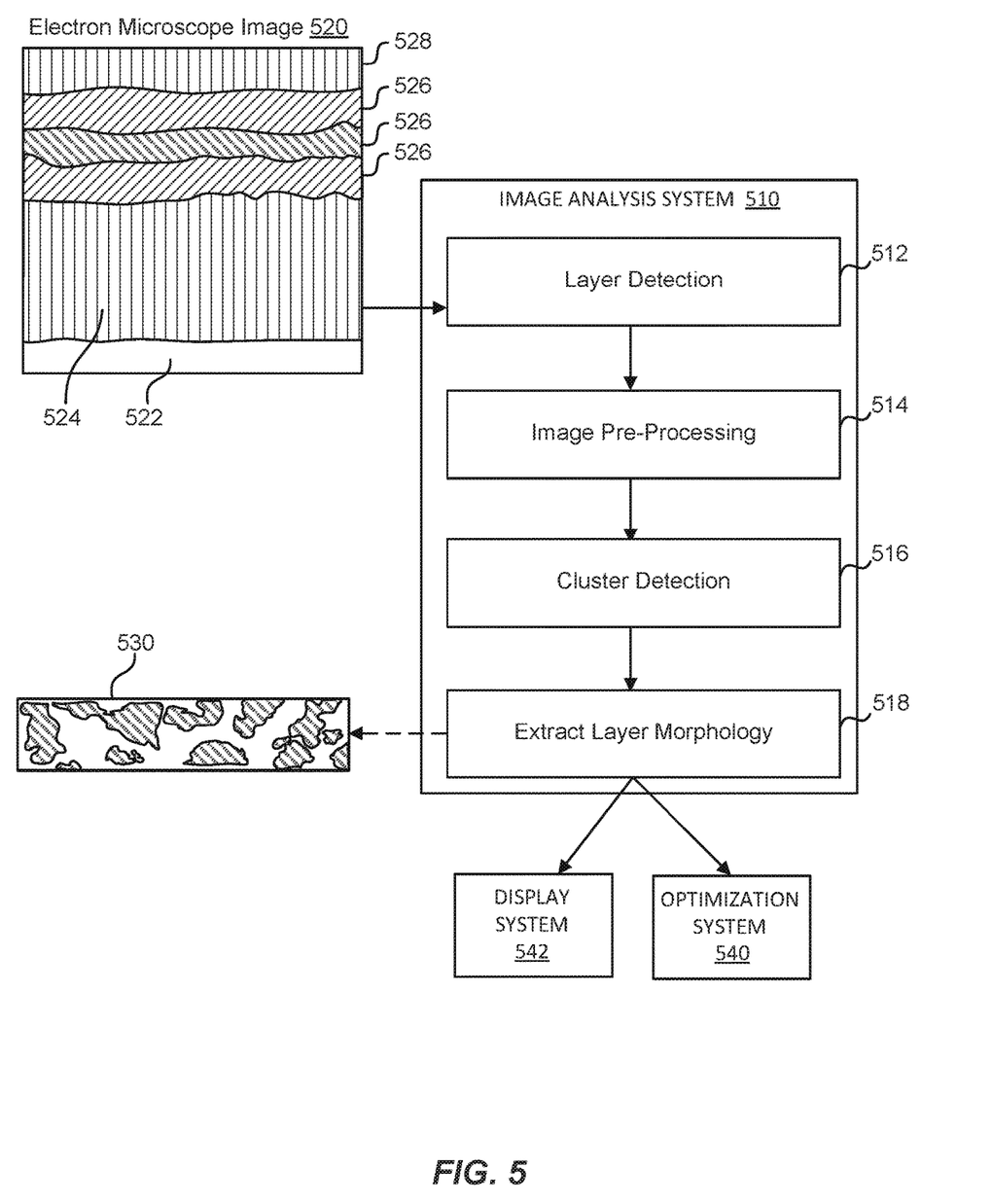
FIG. 5 is a diagram of an image analysis system configured to extract composite morphology from microscope images, according to embodiments described herein.

FIG. 5 is a diagram of an image analysis system 510 configured to extract composite morphology from microscope images, according to embodiments described herein. The image analysis system 510, as described in more detail in reference to FIG. 4, may be configured to process microscope images and to predict layer morphology using regions of the microscope images. The image analysis system 510 may be implemented as a software module, executed by a system also implementing one or more of the operations of the method 400 of FIG. 4. Alternatively, the image analysis system 510 may be or include a separate system, device, or software module. As with the operations of FIG. 4, the operations of FIG. 5 are not described as being in a specific or particular order, and may be executed in alternative orders, may include additional operations, or may omit operations.

In some embodiments, the image analysis system 510 may be configured to receive, obtain, or access microscope images 520. As described in more detail in reference to FIG. 4, the microscope image 520 may be or include an image of a composite solar absorber coating or a constituent material. The microscope image 520 may be generated by an imaging technique that is sensitive to Z-contrast, such that the composition of the layers and the layer morphology may be extracted from the microscope image 520. For example, the microscope image may be generated by high-resolution transmission electron microscopy, by Z-contrast high-resolution scanning electron microscopy, and/or by atomic force microscopy. As an illustrative embodiment, the microscope image 520 may include a region corresponding to a substrate 522, a reflective layer 524 (e.g., pure metal such as tungsten), one or more refractory-metal composite layers 526, and an anti-reflective layer 528, as described in more detail in reference to FIG. 2.

In some embodiments, the microscope image 520 may be taken in by the image analysis system 510 and processed to detect different layers at operation 512. For example, layer detection may include, but is not limited to, determining which regions of the image correspond to pure materials or to composite materials, and identifying, based, for example, on the phase of the material, whether the layer is crystalline or amorphous. Layer detection may include edge detection, for example, where the microscope image includes atomic planes that are detectable as edges in a region of a crystalline material layer.

Subsequent layer detection, the image analysis system may process the image at operation 514. Processing the image may include identifying a region of pure amorphous matrix (e.g., silicon carbide in a third layer being substantially free of tungsten), and using the image from the pure amorphous matrix as a background to implement background subtraction. The processing may include image alignment and brightness normalization to compensate for regions having non-uniform brightness, for example, as a result of artifacts or aberrations affecting the imaging process.

Subsequent image pre-processing, the image analysis system 510 may detect clusters in a composite layer 526 of the microscope image 520 at operation 516. Cluster detection may include a masking using a particle detection algorithm. For example, noise that is characteristic of the imaging technique may create artifacts in the microscope image 520 that could impact the processing of the microscope image 520. In an illustrative example, operation 516 may include applying a close mask in an image segmenter to remove any clusters less than a characteristic dimension (e.g., characteristic dimension 236 of FIG. 2). For example, clusters smaller than or about 3 nm, smaller than or about 2 nm, smaller than or about 1 nm, or smaller, may be removed from the image.

Subsequent cluster detection, the image analysis system 510 may extract layer morphology at operation 518. As described in more detail in reference to FIG. 4, operation 518 may include classifying a region of the microscope image 520 corresponding to a composite that has been pre-processed to attribute clusters to one of a number of classes. For example, the layer morphology may be predicted using a support vector machine machine-learning model to find the boundaries of the metal clusters in the region. The output of operation 518 may include a morphology map 530 that may be used for predicting the absorptance of a solar absorber coating. As an output of the image analysis system 510, the morphology map 530 may be presented as part of a visualization using a display system, or may be provided to an optimization system 540, configured to implement one or more operations of the method 400.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention as claimed has been specifically disclosed by embodiments and optional features, modification and variation of the concepts herein disclosed may be resorted to by those skilled in the art, and that such modifications and variations are considered to be within the scope of this invention as defined by the appended claims.

The description provides preferred exemplary embodiments only, and is not intended to limit the scope, applicability or configuration of the disclosure. Rather, the ensuing description of the preferred exemplary embodiments will provide those skilled in the art with an enabling description for implementing various embodiments. It is understood that various changes may be made in the function and arrangement of elements without departing from the spirit and scope as set forth in the appended claims.

Specific details are given in the description to provide a thorough understanding of the embodiments. However, it will be understood that the embodiments may be practiced without these specific details. For example, specific computational models, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Example 1

Ultrathin Nanocomposite Solar Absorber with Superior Thermal Stability

1. Absorber Coating Materials, Preparation, and Characterization:

Absorber coatings covering the solar spectrum with low thermal emission are of significant interest in solar thermal technologies such as solar hot water and concentrated solar power. Embodiments described herein include ultrathin coatings and composites that include an ultrathin absorptive stack of amorphous silicon carbide deposited on infrared-reflective layer coated silicon substrate with improved solar absorptance and reduced thermal emittance. Silicon carbide with different polymorphs is a material with an increasing number of applications, owing to its tunable wide bandgap (23-3.2 eV), high radiation resistance, stability at high temperatures, and high thermal conductivity. Higher optical absorption of amorphous silicon carbide in the photon energy region below the band gap with respect to its crystalline phase suggests use for high temperature light absorption applications. The optical performance of amorphous/crystalline silicon carbide may be significantly influenced by the respective fabrication processes. A thick single layer of as-sputtered amorphous silicon carbide with thickness above 1 µm may behave as a blackbody absorber over the range of 250 nm to 20 µm. The infrared transparency can be improved by depositing silicon carbide with thickness below 100 nm on a metallic substrate. The uniform refractive index of the as-deposited film may lack interference effects, and may thus present a narrow but near perfect absorption band. To further reduce the reflection of incident light, a refractive indices gradient may be created within the silicon carbide matrix by incorporating metal tungsten nano-clusters.

An ultrathin broadband absorptive stack of silicon carbide-tungsten nanocomposite was fabricated using a high-throughput co-sputtering approach with excellent thermal and oxidation resistance at 630 degree centigrade and 750 degree centigrade, respectively. The absorptive stack included three layers of silicon carbide from bottom to top with thickness of 33, 25, and 20 nm containing tungsten nano-clusters in the layers at concentrations of 28%, 12%, and 0%, respectively. When deposited on any infrared reflective film and topped with 25 nm silicon oxide antireflection layer, the fabricated nanocomposite stack exhibited solar absorptance of 95.45% and thermal emissivity below 0.1 at 650 K. Besides contributing to the solar absorptance, silicon carbide also acted as a diffusion barrier, thus preventing the interlayer migration of tungsten nano-clusters during the annealing process. High resolution transmission electron microscopic images, coupled with optical simulations, confirmed the concentration of light around 4-7 nm sized irregular tungsten nano-clusters in silicon carbide. This class of silicon carbide nanocomposites containing metal nano-clusters has significant potential to improve the photothermal efficiency of solar thermal technologies, particularly at operating temperatures found in solar concentrators.

Depending on the fabrication method, thin films of silicon carbide have different values of optical constants in the same wavelength range. The refractive indices of crystalline silicon carbide (6H-silicon carbide hexagonal crystal) differ from sputtered silicon carbide films deposited at room temperature, which are predominantly amorphous in nature. Consequently, considerable optical performance mismatch among the designed and fabricated films is found when using optical constants obtained from the literature. As such, the refractive index and extinction coefficient of as-sputtered amorphous silicon carbide thin film were fitted from ellipsometry characterization.

The silicon carbide thin film exhibited a non-zero extinction coefficient and refractive index of 2.3-2.6 in the wavelength range of 250-700 nm, which differs from other dielectrics, such as silicon oxide and aluminum oxide. The single layer of sputtered silicon carbide with thickness below 100 nm on infrared-reflective substrate exhibited near perfect but narrow absorption band centered in the range of 450-1000 nm. By incorporating tungsten nano-clusters with certain concentration (10-40%) into the silicon carbide matrix, both refractive indices and extinction coefficients increased from that of pure silicon carbide within the wavelength range of 250-1000 nm. Nanocomposite films were found to broaden the intrinsic narrow absorption band of silicon carbide films through an interference effect. Particularly, the increase of refractive index in the wavelength range of 400-1000 nm provides a material having a broad absorption range with high degree of destructive interference effect. In this way, a spectrally selective solar absorber may be optimized by tuning the refractive indices and thicknesses of each layer to obtain destructive interference at wavelengths around 0.4 µm and 1.5 µm.

Adding an additional layer of silicon carbide with tungsten nano-clusters above a silicon carbide layer results in a broadening of the absorption of the composite coating, and is accompanied by a slight red shift in the absorptance curve. Tungsten is a good candidate as an infrared-reflective layer owing to its high reflectance in infrared region (R %=94.6 at λ>2.5 µm) and high thermal stability. As a result, tungsten nano-clusters within the silicon carbide matrix not only contribute to the solar absorption but also contribute to the low emissivity in the mid-infrared region. The concentration of tungsten nano-clusters within the silicon carbide matrix was gradually decreased to zero from bottom to top over three composite layers. Hence, the absorptive stack included three layers of silicon carbide from bottom to top with thickness of 33, 25, and 20 nm and concentration of tungsten nano-clusters is 28%, 12%, and 0%, respectively. The non-zero extinction coefficient of top most layer of pure silicon carbide also contributed towards the reflection of some of the solar irradiations. Therefore, when topped with an additional layer of silicon oxide as an anti-reflective layer, the measured solar absorptance of as-fabricated ultrathin absorptive stack of silicon carbide reached 95.45% in the range of 280-2000 nm.

In the mid infrared range, the absorber coating indicated a sharp transition from high absorptance to low absorptance, suggestive of significant reflectivity of absorptive stack and tungsten substrate at longer wavelengths. At higher operating temperatures of 630 degree centigrade and 750 degree centigrade, ultrathin absorptive stack of nanocomposite silicon carbide exhibited emissivity of 0.18 and 0.22, respectively. The thermal emittance is thought to increase due to the redshift of the spectrum, which can be compensated through increasing the optical concentration and then decreasing the weighting factor as considering the eventual conversion efficiency. In comparison to a commercially available silicone-based paint used for high temperature solar thermal applications, which has solar absorptance of 96-97% and hemispherical emittance from 0.80 to 0.89 at temperatures ranging from 95 degree centigrade to 1100 degree centigrade, this ultrathin silicon carbide based solar absorber coating exhibited solar absorptance of 95.45% with low thermal emissivity of 0.18 and 0.22 at 630 degree centigrade and 750 degree centigrade, respectively. This constitutes a significant improvement in emissivity of the coating material, which implicates an improved efficiency of the absorber coating.

The three-layered absorptive stack with thickness of 78 nm was deposited on 100 nm tungsten coated silicon substrate. The full stack exhibited distinguishable interfaces among different layers in microscope imaging. At lower magnification, the contrast among different layers was attributable to the presence of different masses of atoms. Tungsten with higher atomic mass appeared to be darker, while on the other hand, low atomic weights of silicon, carbon and oxygen atoms appeared to be lighter in the transmission electron microscope (TEM) images. A prominent gradient change was observed in the contrast from bottom to top layer of three-layered absorptive stack, which indicated the presence of highest concentration of tungsten nano-clusters in the bottom layer. While top most layer with lighter color show no tungsten nano-clusters. Amplitude contrast imaging (e.g., Z-contrast imaging) was verified by capturing images in scanning-tunneling electron microscopy mode, in which higher signal intensity was attributable to scattered electrons from heavier atoms. This technique is highly sensitive to the atomic number of the atoms present in the sample, allowing Z-contrast images to be recorded.

The multilayer surface-covering assembly or spectrally selective solar radiation absorber described herein can be fabricated using a co-sputtering or vapor deposition process. In some embodiments, the vapor deposition comprises a physical vapor deposition process. Physical vapor deposition processes are described, for example, in "Mechanical Alloying: Energy Storage, Protective Coatings, and Medical Applications," Third Edition, 2020, by M. Sherif El-Eskandarany. Thus, in some embodiments, the first composite layer, the second composite layer, and/or the third composite layer is deposited using co-sputtering or vapor deposition. In some embodiments, the vapor deposition comprises a physical vapor deposition process. In some embodiments, the first composite layer, the second composite layer, and/or the third composite layer is deposited at a temperature from about 25 degrees C. to about 400 degrees C.

Microscopy provided information about the microstructure and crystalline or amorphous nature of each layer in as-fabricated full stack. Transmission electron microscope images of top two layers of silicon carbide: with 0% and 12% of tungsten nano-clusters confirmed the amorphous nature of both films, however, silicon carbide film with 12% of tungsten nano-clusters exhibited some periodicity compared to pure silicon carbide film. This indicated the presence of extremely small tungsten nano-clusters (<2 nm). The higher concentration of tungsten nano-clusters (28%) into the silicon carbide matrix induced order of crystallinity in the composite film. The size of nano-clusters was determined to be in the range of 4-7 nm and exhibited an irregular shape in cross section. The bright-field transmission electron microscope image indicated that crystalline nano-clusters smaller than 10 nm in diameter, were embedded uniformly in the amorphous silicon carbide matrix.

Morphological information is important for analysis of nanocomposites with thicknesses less than 100 nm for light absorption applications. The absorptive stack of silicon carbide contains different concentrations of tungsten nano-clusters. Atomic force microscopy mapping of a top surface of silicon carbide-W (28%) films showed smooth morphology with root mean square roughness value of 1.35, confirming the presence of metallic nano-clusters encapsulated in the silicon carbide matrix. To understand the light trapping mechanism within the absorptive stack, the morphology of silicon carbide-tungsten (28%) was extracted from the amplitude contrast in transmission electron microscope images. The higher values of extinction coefficient of silicon carbide-tungsten (28%) layer compared to silicon carbide-tungsten (12%) layer was linked to the self-formed morphology of tungsten nan-clusters during the fabrication process. In contrast, an intermediate silicon carbide-tungsten (12%) layer contained low concentration of tungsten, and thus presented a homogeneity in transmission electron microscope images and lower extinction coefficient relative to the tungsten rich layer.

The as-extracted pattern from the transmission electron microscope images was included in finite-difference time domain OM) simulation to investigate the effect of nano-clusters on the optical performance of the absorber. The absorptance of silicon carbide-tungsten (28%) layer was calculated in two different ways; (i) by using as-measured effective refractive indices of nanocomposite single layer from ellipsometry, (ii) by using refractive indices of silicon carbide and tungsten into the as-extracted patterns from transmission electron microscope images. The dark and light regions in the processed transmission electron microscope image was imported in FDTD simulation and classified as tungsten and silicon carbide, respectively. For a single silicon carbide-tungsten (28%) layer, both cases exhibited a reasonable match between measured and calculated absorptance. However, predicted absorptance using extracted patterns from transmission electron microscope images exhibited better agreement to empirical measurements from fabricated samples. At longer wavelengths ($\lambda$=500 nm), incident energy is concentrated more around the 4-7 nm sized irregular tungsten nano-clusters. All these factors collectively, contribute to the enhanced absorption ranging from 450 to 1500 nm.

Energy distribution at different wavelengths for a composite layer stack was estimated. When considering the extracted pattern of silicon carbide-tungsten (28%) layer from transmission electron microscope image, significant localized absorption was observed, demonstrating the contribution of tungsten nano-clusters, specifically at longer wavelengths. On the contrary, the top most silicon carbide and silicon carbide-tungsten (12%) layers also provided a graded refractive index, and allowed incident radiation to penetrate through the stack and minimize reflection at interfaces internal to the solar absorber coatings. An additional layer of silicon dioxide further minimized the reflection from 250-450 nm, thus boosting the overall measured absorption of the coating from 91% to 95.45% in the range of 250-2000 nm. The minimized reflection was attributable to the destructive interference among the reflected light from the topmost interface of absorptive stack and the reflected light at the surface of the anti-reflective layer. This can be established by depositing a layer with a quarter-wave optical thickness (QWOT), often determined by $$\left(d = \frac{\lambda}{4n_{ar}}\right),$$

where d denotes the thickness of the coating, $\lambda$ is the wavelength of $_a$interest and ns the refractive index of the antireflection coating.

2. Design and Optimization of Ultrathin Absorptive Stack of Silicon Carbide:

Traditionally, the solar absorber coatings for low/high temperature applications are designed via transfer matrix calculations using either refractive indices of pure films from literature or refractive indices from as-fabricated nano-composite films. This strategy is suitable for designing coatings based on multilayer structures and thick cermet layers. However, designing nanocomposite solar absorber coatings and the performance prediction is challenging when the thickness is below 100 nm. To cope with this issue, we proposed a novel design and optimization approach which combines measured effective refractive indices and the complex morphology of ultrathin nanocomposite layers in finite-difference time-domain (FDTD) calculations to design solar absorber coatings. The advanced analytical tools including high resolution transmission electron microscopy and atomic force microscopy can be used to extract the morphology of metal nano-inclusions in the matrix and on the top surface, respectively.

This approach was implemented on a silicon carbide absorptive stack with tungsten nano-inclusions for high temperature applications. In this example, the morphology of tungsten nano-inclusions in the silicon carbide layer was extracted from high resolution transmission electron microscope images. The first layer overlying a substrate was tungsten as a reflective layer, while absorptive stack included three layers of silicon carbide-tungsten with thickness of 33, 25, and 20 nm and metal fractions of 28%, 12%, and 0%, respectively. The absorptive stack was topped with 25 nm of anti-reflective layer. The silicon carbide layer with 28% tungsten nano-inclusions was discontinuous with distinct morphology, which was extracted via image processing. In this process, the brightness of the background was aligned between the pure silicon carbide image and silicon carbide with 28% tungsten nano-inclusions. Then the later images were subtracted from the aligned former image to keep a signal only for tungsten nano-inclusions. To find the boundaries of the tungsten clusters in the subtracted image, a machine learning—Support Vector Machine was applied for materials identification. However, pre-image processing was necessary for the reason that the silicon carbide image gives some high-frequency noises. A close mask in image segmenter algorithm was applied to the image to remove clusters smaller than 1 nm. A Gaussian kernel in the Support Vector Machine was implemented to determine the boundaries of the irregular tungsten cluster.

The present strategy provided more accurate designs of thin films solar absorber, and may permit high throughput and low-cost fabrication. The calculated optimized thickness of absorptive stack was below 100 nm and when topped with silicon dioxide as an anti-reflective layer, the calculated absorption can reach to 94.54%, which agrees with experimental results.

3. Thermal Stability and Oxidation Resistance of Ultrathin Silicon Carbide Solar Absorber Coatings:

Absorptance spectra of ultrathin silicon carbide absorptive stack deposited on tungsten substrate were measured between 250 nm and 2000 nm before and after annealing at different conditions. After thermal annealing in vacuum and air, the reflectance spectra only showed a negligible variation in the absorptance, which indicates good thermal and oxidative stability of as-deposited ultrathin silicon carbide absorptive stack even without top anti-reflection layer, thus excluding the role of silicon oxide top layer for enhancing the thermal stability of the absorptive stack. Owing to the re-arrangements of atomic grains, the thermal annealing of silicon carbide around 730 degree centigrade may lead to compressive stress reduction, increasing mechanical stability and adhesion, as well as lower optical band gap (higher solar absorption).

Silicon carbide also may also act as a diffusion barrier, which prevents the oxidation or diffusion of metal nano-clusters at higher temperatures, thus, maintains the optical properties of the absorptive stack. The as-fabricated ultrathin silicon carbide with tungsten nano-clusters absorptive stack deposited on tungsten substrate maintained optical performance after annealing in 750 degree centigrade in vacuum, and 630 degree centigrade in air. In addition, the absorptive stack when topped with 25 nm thick $SiO_2$ as an anti-reflection layer was annealed in vacuum and air at different temperatures for 24 hours, Total solar absorptance, for p and s polarization directions, demonstrated the omni-directional and polarization-independent properties. For example, as the incident angle increased from 45° to 60°, the total absorption of the absorbers in the range of 280-2000 nm under s and p polarization directions did not change remarkably, unlike absorbers based on strong interference in ultrathin films.

With these merits, the proposed ultrathin silicon carbide solar absorber coatings have demonstrated their outstanding average absorptance of 95.45% over the wide solar irradiance spectrum ranging from 280 to 2000 nm. To intuitively understand the thermal stability of the ultrathin silicon carbide solar absorber, we put forward the strengthening mechanism based upon the aforementioned analyses. Owing to outstanding properties such as high rigidity, good thermal stability, and imperviousness to the oxidation, the silicon carbide acts as diffusion barrier in multilayer absorptive stack, thus, preventing the oxidation or diffusion of metal nano-clusters during the annealing process at higher temperatures. Thus, the solar absorber coating maintained its optical performance at annealing temperatures of 630 degree centigrade and 750 degree centigrade in air and vacuum, respectively. The materials and techniques described herein may facilitate the design and optimization of a new class of selective solar absorbers for enhancing solar energy harvesting at medium-to-high temperatures in various systems including but not limited to solar heating and cooling, concentrated solar power, solar thermoelectrics, and solar thermal photovoltaics.

All publications, patents, and patent applications cited herein are hereby incorporated by reference in their entirety for all purposes.

What is claimed is:

1. A multilayer surface-covering assembly adapted to convert solar radiation to heat, the multilayer surface-covering assembly comprising:
   a first composite layer comprising a first amorphous refractory material and first metal nanoparticles, wherein the first amorphous refractor material encapsulates the first metal nanoparticles, and wherein the first composite layer is thermally coupled with a surface of a structure for conduction of heat from the first composite layer to the structure; and
   an antireflective layer, wherein the first composite layer is disposed between the antireflective layer and the surface of the structure;
   wherein the assembly has been annealed at a temperature of about 750 degree centigrade in vacuum.

2. The multilayer surface-covering assembly of claim 1, further comprising an infrared-reflective layer on silicon substrate disposed between the first composite layer and the surface of the structure.

3. The multilayer surface-covering assembly of claim 1, wherein the first amorphous refractory material prevents diffusion of the first metal nanoparticles within the first refractory coating and prevents oxidation of the first metal nanoparticles, wherein the first metal nanoparticles have a characteristic dimension in a range of 4-7 nm.

4. The multilayer surface-covering assembly of claim 1, further comprising a second composite layer comprising a second amorphous refractory material and second metal nanoparticles, wherein:
the second amorphous refractor material encapsulates the second metal nanoparticles,
the second composite layer is disposed between the first composite layer and the antireflective layer, and
a first weight/volume percentage concentration of the first metal nanoparticles in the first composite layer is greater than a second weight/volume percentage concentration of the second metal nanoparticles in the second composite layer.

5. The multilayer surface-covering assembly of claim 4, further comprising a third composite layer comprising a third amorphous refractory material and third metal nanoparticles, wherein:
the third amorphous refractor material encapsulates the third metal nanoparticles,
the third composite layer is disposed between the second composite layer and the antireflective layer, and
a third weight/volume percentage concentration of the third metal nanoparticles in the third composite layer is less than the second weight/volume percentage concentration.

6. The multilayer surface-covering assembly of claim 5, wherein:
the first metal nanoparticles comprise tungsten nanoparticles;
the first amorphous refractory material comprises silicon carbide;
the second metal nanoparticles comprise tungsten nanoparticles;
the second amorphous refractory material comprises silicon carbide;
the third metal nanoparticles comprise tungsten nanoparticles; and
the third amorphous refractory material comprises silicon carbide.

7. The multilayer surface-covering assembly of claim 6, wherein:
the first weight/volume percentage concentration is equal to or greater than 20%;
the second weight/volume percentage concentration is equal to or greater than 5% and equal to or less than 30%; and
the third weight/volume percentage concentration is 0% to equal to or less than 10%.

8. The multilayer surface-covering assembly of claim 1, wherein the assembly maintains its optical performance after thermal annealing in vacuum and air.

9. A method of forming a multilayer surface-covering assembly adapted to convert solar radiation to heat, the method comprising:
depositing a first composite layer so as to be in thermal communication with a surface of a structure for conduction of heat from the first composite layer to the structure, wherein the first composite layer comprises a first amorphous refractory material and first metal nanoparticles, and wherein the first amorphous refractory material encapsulates the first metal nanoparticles; and
depositing an antireflective layer, wherein the first composite layer is disposed between the antireflective layer and the surface of the structure; and
annealing the assembly at a temperature of about 750 degree centigrade in vacuum.

10. The method of claim 9, further comprising:
prior to annealing, depositing a second composite layer so as to be in thermal communication with a surface of the first composite layer, wherein the second composite layer comprises the first amorphous refractory material and the first metal nanoparticles, wherein the first amorphous refractory material encapsulates the first metal nanoparticles, and wherein a concentration of the first metal nanoparticles in the second composite layer is less than a concentration of the first metal nanoparticles in the first composite layer; and
depositing a third composite layer so as to be in thermal communication with a surface of the second composite layer, wherein the third composite layer comprises the first amorphous refractory material and is substantially free of the first metal nanoparticles.

11. The method of claim 10, wherein:
the concentration of the first metal nanoparticles in the first composite layer is approximately 28%; and
the concentration of the first metal nanoparticles in the second composite layer is approximately 12%.

12. The method of claim 9, wherein the first amorphous refractory material comprises silicon carbide, and wherein the first metal nanoparticles comprise tungsten.

13. The method of claim 10, wherein the first composite layer, the second composite layer, and/or the third composite layer is deposited using co-sputtering or vapor deposition, wherein the first composite layer, the second composite layer, and/or the third composite layer is deposited at a temperature from about 25° C. to about 400° C.

* * * * *